United States Patent [19]

Sailor et al.

[11] Patent Number: 5,318,676
[45] Date of Patent: Jun. 7, 1994

[54] PHOTOLITHOGRAPHIC FABRICATION OF LUMINESCENT IMAGES ON POROUS SILICON STRUCTURES

[75] Inventors: Michael J. Sailor, La Jolla; Vincent V. Doan, San Diego, both of Calif.

[73] Assignee: The Regents of the University of California, Oakland, Calif.

[21] Appl. No.: 901,752

[22] Filed: Jun. 22, 1992

[51] Int. Cl.$^5$ ................................................ C25F 3/12
[52] U.S. Cl. .............................. 204/129.3; 204/129.65; 204/129.75; 204/129.95
[58] Field of Search ............ 204/129.3, 129.65, 129.75

[56] References Cited

U.S. PATENT DOCUMENTS

| | | | |
|---|---|---|---|
| 4,303,482 | 12/1981 | Bühne et al. | 204/129.3 |
| 4,380,865 | 4/1983 | Frye et al. | 204/129.3 X |
| 4,460,621 | 7/1984 | Pearlman | 56/645 X |
| 4,874,484 | 10/1989 | Foell et al. | 204/129.3 |
| 5,139,624 | 8/1992 | Searson et al. | 204/129.3 |

FOREIGN PATENT DOCUMENTS

148641  6/1988  Japan ................................ 204/129.3

OTHER PUBLICATIONS

Image-making on silicon at UC opens new vistas in computing; Scott LaFee; San Diego Union Tribune; Jun. 26, 1992; pp. A1 & A11.
Silicon Quantum Wire Array Fabrication by Electrochemical and Chemical Dissolution of Wafers; L. T. Canham; Appl. Phys. Lett. 57 (10); Sep. 3, 1990; pp. 1046-1048.
Shine On, Holey Silicon; Ivan Amato; Science, vol. 252; pp. 922-923, May 17, 1991.
Porous Silicon Formation: A Quantum Wire Effect; V. Lehmann, et al.; Appl. Phys. Lett. 58(8); Feb. 25, 1991; pp. 856-858.
Photolithographic Fabrication of Micron-Dimension Porous Si Structures Exhibiting Visible Luminescence; Vincent V. Doan, et al.; Appl. Phys. Lett. 60(5), Feb. 3, 1992; pp. 619-620.
Luminescent Color Image Generation on Porous Silicon; Vincent V. Doan, et al.; Science, vol. 256; Jun. 26, 1992; pp. 1791-1792.

*Primary Examiner*—Donald R. Valentine
*Attorney, Agent, or Firm*—Brown, Martin, Haller & McClain

[57] ABSTRACT

A polished wafer of single-crystal silicon (Si) is ohmically contacted on its backside to a copper wire to provide a working electrode. The wafer and a counterelectrode are immersed in a solution of aqueous HF and ethanol within an optical quality cuvette. Lithographic images are projected onto the silicon wafer within the solution, and the wafer is etched galvanostatically at a low current density until a predetermined charge density is attained. The areas of an n-type silicon wafer exposed to the light during the etch will exhibit visible luminescence when the wafer is illuminated with an ultraviolet (UV) lamp or other short wavelength visible light. The areas of the wafer that were not exposed to the pattern during etch will not luminesce.

22 Claims, 2 Drawing Sheets

PHOTOLITHOGRAPHIC FABRICATION OF LUMINESCENT IMAGES ON POROUS SILICON STRUCTURES

BACKGROUND OF THE INVENTION

Advances in optical electronics have led the way to more powerful computers, faster and clearer communications and high resolution image displays, among other developments. Progress in the development of optical electronics has been based almost exclusively on III-V semiconductors, e.g., gallium arsenide, or II-VI compounds. These compound semiconductors have direct band gaps which permit rapid recombination of carriers, thus releasing the full band gap energy as light. Most semiconductor diode lasers and LEDs are based on III-V compounds.

Silicon, on the other hand, is the preferred material for microelectronic devices other than optical electronics. Silicon crystals are much easier and cheaper to make, and processing of the devices is considerably less complicated than that of compound semiconductor devices. Silicon's band gap is indirect, resulting in slow recombination rates. Further, its band gap (1.09 eV) is too narrow to generate visible light. Thus, optical electronics systems have primarily been made of hybrid components of gallium arsenide and silicon, in spite of efforts to combine the two substances on a single chip.

Recently it has been determined that by etching nanometer structures in silicon wafers, the silicon can be transformed into a direct band gap material. These structures have been labeled "silicon quantum wires" and are thin columns in which electrons take on higher energy states than they can in larger silicon structures. This behavior has been explained as a quantum confinement due to the very small dimensions of the silicon wire which leads to an increase in effective band gap energy.

Porous silicon is made by electrochemically etching single-crystal silicon in solutions containing hydrofluoric acid (HF). Since a primary interest in photoluminescence of silicon is to convert electrical to optical signals directly and efficiently on a silicon chip, it is necessary to devise a means for incorporating the porous silicon structure into a circuit directly on the single-crystal substrate. It is to such a means that the present invention is directed.

SUMMARY OF THE INVENTION

It is an object of the present invention to provide a process for photolithographic fabrication of luminescent porous silicon structures.

It is another object of the present invention to provide means for replication of gray scale images on silicon wafers.

It is a further object of the present invention to provide means for mapping a gray scale image into a true color scale image.

Yet another object of the present invention is to provide means for storage of holographic information on a silicon wafer.

In the preferred embodiment of the process, a polished wafer of single-crystal (100) n-type silicon (Si) is ohmically contacted on its backside to a copper wire to provide a working electrode. The wafer and a counterelectrode are immersed in a solution of aqueous HF and ethanol (50:50 by volume) within an optical quality cuvette. Lithographic images are projected using a tungsten lamp onto the silicon wafer within the solution, and the wafer is etched galvanostatically at a low current density until a predetermined amount of current has passed. The wafer is removed from the bath and rinsed with ethanol, then air dried. For n-type silicon, the areas of the wafer exposed to the light during the etch will exhibit visible luminescence when the wafer is illuminated with an ultraviolet (UV) lamp or other short wavelength visible light. The areas of the wafer that were not exposed to the light during etch will not luminesce.

For the same steps performed on p-type silicon, a negative image of the projected pattern will be created, and areas that were dark during exposure/etch will be luminescent when the p-type silicon is illuminated with a UV lamp.

The photoluminescence across an image depends on the photocurrent that existed at each particular location on the silicon wafer during the etch. A high contrast projected image will result in a luminescence pattern of dark and light areas. A poly-contrast image, e.g., gray scale image, will induce a variation in etch rates across the wafer due to the variation in exposure intensity. The resultant image will luminesce at different emission energies corresponding to the variations in exposure intensity. A grid or multi-line pattern can be imaged onto the silicon to generate a three-dimensional diffraction grating, and use of a hologram as a modulating means will allow storage of holographic data on silicon.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
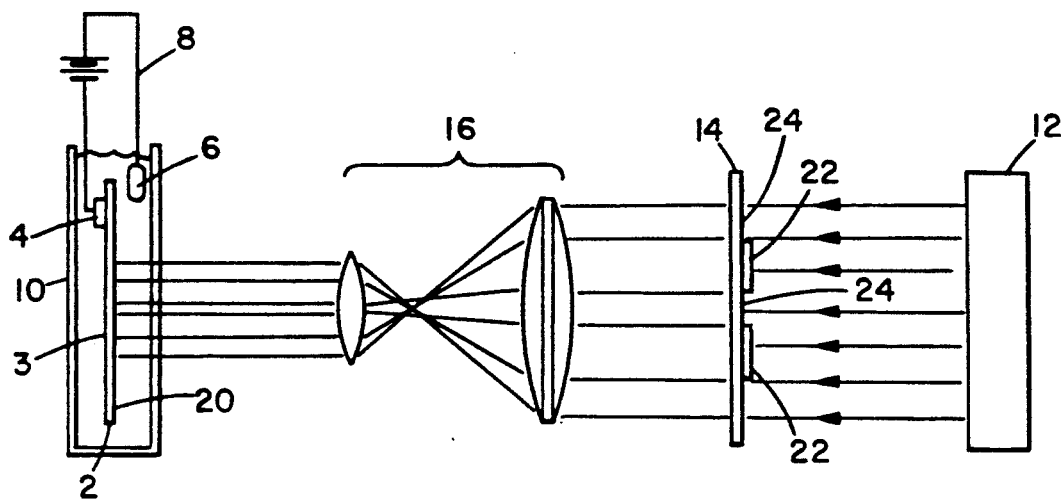
FIG. 1 is a diagrammatic view of the apparatus for photolithographic fabrication of porous silicon.

As illustrated in FIG. 1, single-crystal silicon 2, in the form of a wafer or some portion thereof is ohmically contacted on its backside 3 by a copper wire for use as a working electrode in a two-electrode electrochemical cell. A platinum flag 6 is attached to a platinum wire 8 for use as a counterelectrode. The wafer 2 and platinum flag 6 are immersed in a 50:50 (by volume) solution of aqueous HF and ethanol within an optical quality plastic cuvette 10. A high intensity lamp 12 illuminates mask 14 which contains the image to be projected so that the image is projected through reducing optics 16 onto the polished face 20 of wafer 2. The light modulated by mask 14 will determine the areas on the wafer 2 at which porous silicon will be produced. If wafer 2 is n-type, the areas corresponding to transmissive areas 24 of mask 14 will become porous silicon. For a p-type wafer, the areas corresponding to non-transmissive portions 22 of mask 14 will become porous silicon. After etch, the wafer 2 is removed from the solution, rinsed with ethanol and air dried. When the samples are illuminated with a UV or other short wavelength light, luminescence is visible to the naked eye as a red-orange to yellow glow.

In laboratory testing, single-crystal polished (100) wafers of phosphorous-doped (n-type) silicon of 0.95 ohm-cm resistivity and boron-doped (p-type) silicon of 0.36 ohm-cm resistivity were cut into rectangles with areas of approximately 0.3 $cm^2$. Ohmic contacts were generated on the back by scratching with Ga-In eutectic and affixing a copper wire with silver print. The contact and the edges of the silicon were coated with epoxy for use as the working electrode. The counter-electrode was a platinum flag with a press contacted platinum wire attached. The etching bath was a 50:50 (by volume) solution of aqueous 49% HF and 95% ethanol. The projection lamp was a 300 watt ELH-type tungsten lamp filtered through interference filters with 20 nm bandpass. Luminescent porous silicon resulted after etching at approximate current densities of 0.5 $mA/cm^2$ until a total of approximately 1.0 (for n-type Si) or 10.0 (for p-type Si) $coulombs/cm^2$ had been passed. The samples were then removed from the bath, rinsed with ethanol and air dried. Illumination with a small UV lamp resulted in visible luminescence.

Both the exposure light source and the excitation light source can cover a wide range of wavelengths from infrared to ultraviolet, including white light. The wavelength of the exposure light may be selected according to the desired resolution quality. Shorter wavelengths (UV) provide better resolution, as is generally known in photolithography, while IR radiation provides deeper penetration into the silicon, which may degrade resolution.

The resistivity of both the n- and p-type silicon is not critical, and the luminescence effect can be generated in silicon ranging from near intrinsic to doping levels below that where metallic behavior occurs.

The form of the silicon is not limited to single-crystal silicon wafers. There are indications that amorphous silicon may also be acceptable for formation of luminescent porous silicon. In some situations, it may be preferable to utilize silicon on sapphire (SOS) or some other form of silicon on an insulating substrate to limit etch depth. For example, this may be the preferred embodiment for optical data storage. Porous SOS has the additional advantages that both the exposure light and the excitation light may be directed through the backside of the substrate, and detection of luminescence can be done on both the face and backside of the device.

The etch time is not critical, however, resolution improves with longer etch times. The etch time will also impact interference behavior when the porous silicon is excited with white light. In this case, the longer the etch, the longer the wavelength of the false color generated by interference. The current density need not be 0.5 $mA/cm^2$, but will be most effective if kept with a factor of 10 of 0.5 $mA/cm^2$.

Single-crystal silicon electrodes immersed in HF etching solutions display rectification properties analogous to Schottky barriers. The anodic current necessary for porous silicon formation corresponds to the forward-bias current for p-type silicon, and the reverse-bias current for n-type silicon electrodes. Since the reverse-bias current at n-type silicon is limited by the junction barrier to a small value, anodic corrosion does not occur at n-type silicon unless the electrode surface is illuminated. The illumination generates electron-hole pairs that are separated by the electrostatic barrier of the silicon/electrolyte interface. For n-type silicon, holes migrate to the surface and increase the rate of corrosion. Correspondingly, illumination of p-type silicon inhibits corrosion.

In an n-type silicon sample, the regions that are not illuminated during etch display no evidence of porous silicon formation, while those that are illuminated show the characteristic luminescent porous silicon surface. In contrast, illumination of p-type silicon electrodes result in photo-cathodic protection, and patterns projected onto p-type silicon generate negative images of luminescent porous silicon. Electron micrographs of the luminescent regions on both p- and n-type silicon substrates indicate that the pore size is on the order of 200 nm or less.

The resolution attained on either p- or n-type material is highly dependent on light intensity, with higher light intensities generally producing poorer resolution. The shorter the wavelength of the exposure illumination, the better the resolution.

Figure 2:
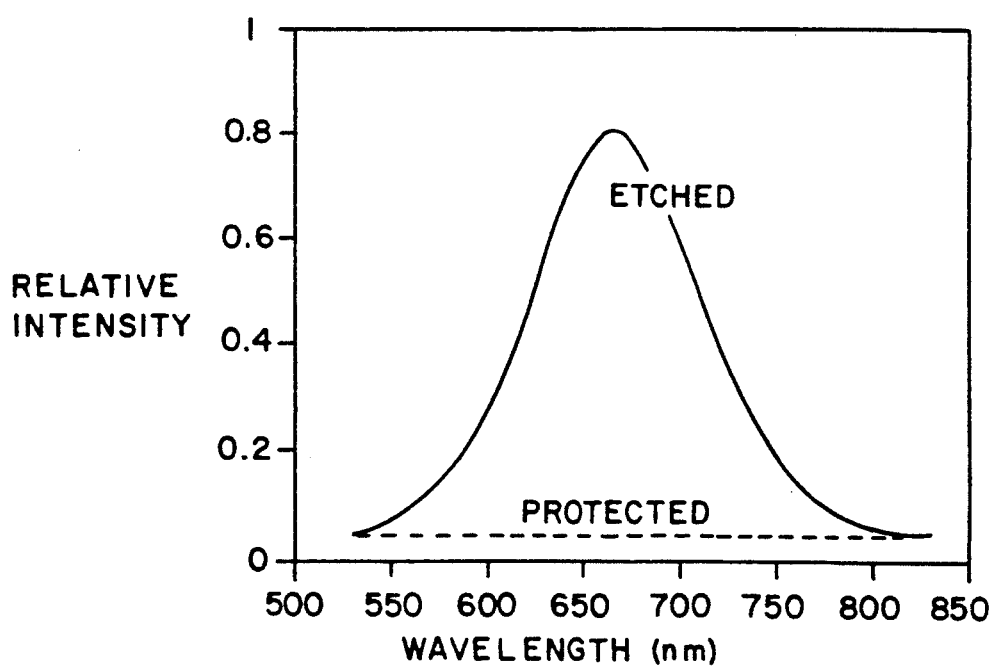
FIG. 2 is a plot of room-temperature emission spectra of etched and unetched regions and n-type silicon sample.
Figure 3:
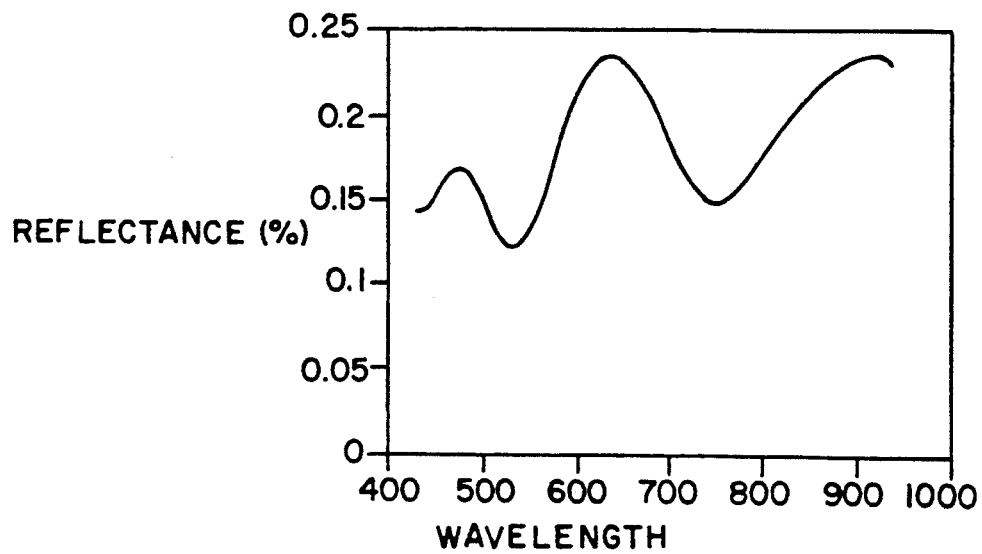
FIG. 3 is a plot of reflectance versus illumination wavelength at a single location of a porous silicon image.

The emission spectra of etched and protected regions on an n-type silicon electrode are illustrated in FIG. 2. Emission spectra of the porous silicon regions taken immediately on removal of the sample from the etching bath typically displays broad (200 nm FWHM) peaks with maximum wavelength between 750 to 650 nm.

Where the mask consists of black-and-white polycontrast (gray scale) images on n-type silicon, higher energy spectra are seen at locations on the porous silicon that were more brightly illuminated during the photochemical etch. The images generated on the silicon wafers appear colored under white light illumination due to thin film interference effects. The reflectance spectrum of a small location on a poly-contrast image is illustrated in FIG. 3, and corresponds to an effective optical thickness of 950 nm.

Figure 4:
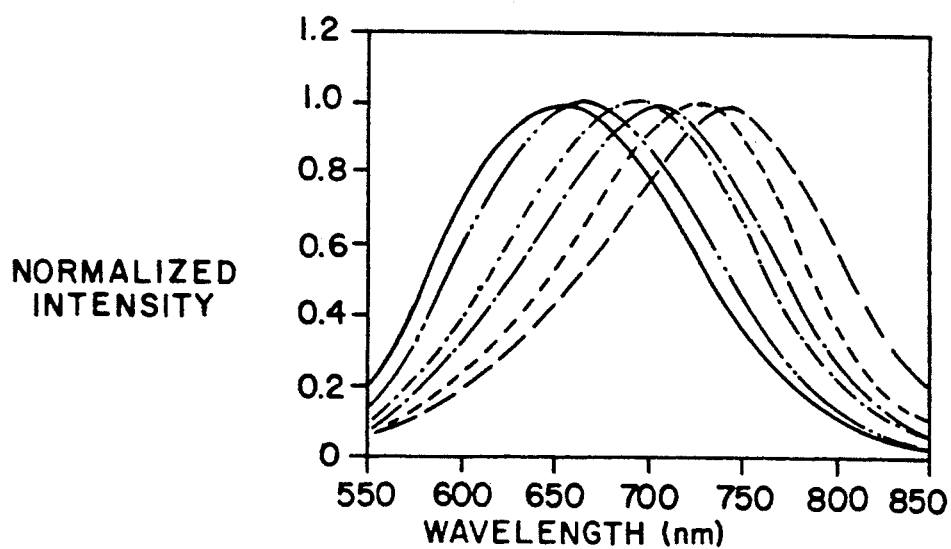
FIG. 4 is a plot of photo emission spectra at different locations on an etched poly-contrast image.

FIG. 4 illustrates the photoluminescence spectra taken at different locations in the poly-contrast image etched on the silicon surface. The photoluminescence emission maximum on porous silicon depends upon the etch rate used in the electrochemical etch. Since the photocurrent at n-type silicon is proportional to light intensity, the intensity variation across the projected image translates into an etch rate variation.

The ability to map gray scale information into a color scale indicates a potential for optical data storage and for use with optical electrical circuits which require a variety of emission wavelengths. The ability to vary etch thickness and modulate light intensity creates optical interference effects which may be useful in the design of optical waveguides utilizing porous silicon as well as the ability to store holographic information in silicon.

The recording of holographic images on photographic film and other photosensitive media, and by digitization of signals produced by photodetectors, is well known. In a similar manner to that used for exposure of photoresist in the production of holographic plates, the above-described technique can be used for storage of holographic information on silicon wafers. The interference fringes which make up the holographic images can be used as a mask which modulates the exposure illumination, which, for porous silicon, can be selected according to the resolution requirements as with other forms of modulation.

The thin film optical interference effects which are visible under white light (room light) generate an image of false colors representative of the optical thickness of the areas of porous silicon. This permits the creation of different color waveguides which, under white light illumination, will permit transmission of multiple wavelengths of light on a single silicon substrate.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A method for generating a luminescent image on a silicon substrate which comprises:
    selecting a substrate having a silicon surface;
    affixing a first electrical conductor for carrying a first charge to a backside of said substrate;
    selecting a second electrical conductor for carrying a second charge opposite said first charge;
    immersing said substrate and said second electrical conductor into a hydrofluoric acid-containing solution;
    projecting an image onto said silicon surface;
    applying a current to said first conductor and said second conductor until an appropriate charge density is attained; and
    removing said substrate from said solution;
    wherein illumination of said silicon surface with short wavelength light causes said silicon surface to luminesce in a pattern corresponding to said image.

2. A method as in claim 1 wherein the step of selecting said substrate comprises selecting doped single-crystal silicon.

3. A method as in claim 2 wherein said silicon is n-type.

4. A method as in claim 3 wherein said appropriate charge density is approximately 1.0 coulomb/cm$^2$.

5. A method as in claim 2 wherein said silicon is p-type.

6. A method as in claim 5 wherein said appropriate charge density is approximately 10 coulombs/cm$^2$.

7. A method as in claim 1 wherein the step of selecting said substrate comprises selecting an insulating substrate upon which a layer of silicon is formed.

8. A method as in claim 1 wherein said hydrofluoric acid-containing solution further contains ethanol.

9. A method as in claim 1 wherein the step of projecting an image comprises:
    selecting an exposure source according to a desired level of resolution of said image.

10. A method as in claim 1 wherein the step of projecting an image comprises projecting an exposure light through a high contrast pattern.

11. A method as in claim 1 wherein the step of projecting an image comprises projecting an exposure light through a poly-contrast or gray scale image.

12. A method as in claim 1 wherein the step of projecting an image comprises projecting an exposure light through a plurality of interference fringes.

13. A method for integrating optical elements on a silicon wafer which comprises:
    selecting a single-crystal silicon wafer;
    placing said silicon wafer in an optically-transmissive acid-resistant container;
    modulating intensity of an exposure light by projecting said exposure light through a patterned mask onto at least a portion of said silicon wafer;
    electrochemically etching said silicon wafer in an HF-containing solution wherein an etch rate corresponds to said intensity of exposure light; and
    forming at least one area of porous silicon on said silicon wafer wherein porosity of said at least one area is modulated corresponding to said patterned mask and said at least one area luminesces when illuminated.

14. A method as in claim 13 wherein the step of selecting said silicon wafer comprises selecting n-type silicon wherein said at least one area corresponds to a positive image of said patterned mask.

15. A method as in claim 13 wherein the step of selecting said silicon wafer comprises selecting p-type silicon wherein said at least one area corresponds to a negative image of said patterned mask.

16. A method as in claim 13 wherein the step of electrochemically etching comprises selecting an HF-containing solution further containing ethanol.

17. A method as in claim 13 wherein said predetermined pattern comprises a high-contrast image.

18. A method as in claim 13 wherein said predetermined pattern comprises a poly-contrast or gray scale image.

19. A method as in claim 13 wherein said patterned mask comprises a plurality of interference fringes.

20. A method as in claim 13 wherein the step of electrochemically etching said silicon wafer is terminated upon achieving an appropriate charge density.

21. A method as in claim 20 wherein said appropriate charge density is 1 coulomb/cm$^2$ for n-type silicon.

22. A method as in claim 20 wherein said appropriate charge density is 10 coulombs/cm$^2$ for p-type silicon.

* * * * *

UNITED STATES PATENT AND TRADEMARK OFFICE
CERTIFICATE OF CORRECTION

PATENT NO. : 5,318,676
DATED : June 7, 1994
INVENTOR(S) : Michael J. Sailor, et al.

It is certified that error appears in the above-indentified patent and that said Letters Patent is hereby corrected as shown below:

- Column 6, claim 17, lines 39 and 40, change "predetermined pattern" to --patterned mask--; and claim 18, lines 41 and 42, change "predetermined pattern" to --patterned mask--.

Signed and Sealed this

Twentieth Day of December, 1994

Attest:

BRUCE LEHMAN

*Attesting Officer*     *Commissioner of Patents and Trademarks*